United States Patent

Wills et al.

[11] Patent Number: 5,847,467
[45] Date of Patent: Dec. 8, 1998

[54] DEVICE PACKAGING USING HEAT SPREADERS AND ASSISTED DEPOSITION OF WIRE BONDS

[75] Inventors: Kendall Scott Wills, Houston; Paul Anthony Rodriguez, Lewisville, both of Tex.

[73] Assignee: Texas Instruments Incorporated, Dallas, Tex.

[21] Appl. No.: 98,008

[22] Filed: Jul. 27, 1993

Related U.S. Application Data

[63] Continuation of Ser. No. 817,972, Jan. 6, 1992, abandoned, which is a continuation of Ser. No. 575,744, Aug. 31, 1990, abandoned.

[51] Int. Cl.⁶ .................................................. H01L 23/29
[52] U.S. Cl. ........................ 257/789; 257/790; 257/796
[58] Field of Search .................................. 357/72, 81, 74; 257/789, 790, 796

[56] References Cited

U.S. PATENT DOCUMENTS

| | | | |
|---|---|---|---|
| 4,882,212 | 11/1989 | SinghDeo et al. | 428/76 |
| 4,888,634 | 12/1989 | Lai et al. | 357/72 |
| 4,942,456 | 7/1990 | Sako | 357/72 |
| 4,950,427 | 8/1990 | Endo | 357/72 |
| 5,097,317 | 3/1992 | Fujimoto et al. | 257/790 |
| 5,194,933 | 3/1993 | Miyagi | 257/790 |

FOREIGN PATENT DOCUMENTS

| | | | |
|---|---|---|---|
| 0214621 | 3/1987 | European Pat. Off. | 257/790 |
| 0168655 | 6/1990 | Japan | 257/790 |
| 0082059 | 4/1991 | Japan | 257/790 |

*Primary Examiner*—David Ostrowski
*Attorney, Agent, or Firm*—Ronald O. Neerings; Richard L. Donaldson

[57] ABSTRACT

A device or die is presented which uses laser deposited leads, with a filler to bridge the gap between the die and the lead frame. The filler may be oxide, poly amide, a combination of oxide layers and poly amide layers, plastic or a plastic which has plastic coated beads of metal. The die and lead frame are placed on a heat spreader. Leads are formed over the filler material from bond pads on the lead frame to bond pads on the die. Various protective materials are placed over the die to protect it from the package. Over the protective material is another heat spreader or other device that is required to make the die function better. Typical devices are batteries, capacitors, or other die. Finally, the structure is encapsulated in a package of non-conductive material. This structure is more stable than presently available structures because the active element, the die, is not in direct contact with the plastic package.

6 Claims, 4 Drawing Sheets

DEVICE PACKAGING USING HEAT SPREADERS AND ASSISTED DEPOSITION OF WIRE BONDS

This application is a continuation of application Ser. No. 07/817,972 filed Jan. 6, 1992 now abandoned; which is a continuation of application Ser. No. 07/575,744 filed Aug. 31, 1990.

FIELD OF THE INVENTION

This invention relates to the packaging of devices using heat spreaders and assisted deposition of wire bonds, and more particularly to plastic packaging using heat spreaders and CVD deposition of wire bonds.

BACKGROUND OF THE INVENTION

Problems associated with currently used techniques for packaging semiconductor devices include:
1. Cracked die—especially at the corners. The problem is due to stress on the die in the package. If the die is in a ceramic package, the die cracks because of voids in the die attach or thermal expansion of the mount which is different from the die. If the die is in a plastic package the problem is due to the plastic stress on the die.
2. Shifted metal'the metal on the device is cracked, broken or distorted by the stress of the plastic package against the die. In a worst case scenario, the metal is sheared off of the die.
3. Sheered ball bonds—the plastic package sheers the bond off of the die because of the plastic stress on the ball bond.
4. Filler induced damage—plastic packaged devices can be damaged by filler in the plastic. The filler presses against the die, breaking the protective overcoat of the die. The die then fails due to contamination.
5. The bond wire touches the die edge—the bond wire touching the die edge causes the die to short to the wire. The die then becomes nonfunctional. In a less extreme case, the wire is just close to the edge resulting in a long term reliability problem. Reasons for the bond wire touching the die range from miss bonding to wires caught in the PIX coating during cure.
6. Die edge touches the attach substrate—on flip chip technology, one of the problems that must be resolved is the height of the bump used to attach the die to the substrate. If the bump is too high, multiple bumps can not be put close enough together to be of use. If the bumps are too low, the die edge touches the substrate.
7. Lack of space for bond pads—there is no longer enough room for the bond pads around the outside edge of the die. Current bonding techniques require that no active circuitry be under the bonding pad.
8. Noise on the ground and power lines—the inductance of the power lines limits the current to the device in peak power surges. The device needs more and better power/ground lines.
9. Device noise—capacitors are needed on the device to reduce the noise in the device.
10. Broken bond wire—during centrifuge tests, the bond wires can break.

Various techniques have been utilized to to resolve some of these problems. To prevent the filler induced damage, different filler sizes and shapes have been tested. The introduction of PIX to improve the alpha sensitivity of the DRAM's has helped reduce filler induced damage, but not enough.

To stop stress on the die, different plastic compositions have been tried. The most common effort has been to match the coefficient of expansion with that of the die. Two techniques come close to resolving this particular problem. The first technique requires a heat spreader below the die. This technique, however, does not provide protection for the bonding wires. In the second technique, a ceramic cap is placed over the die to prevent the plastic from coming in contact with the die on the top side. The cap is needed to enclose a tall arch for the bonding wires attached from the bonding pad to the lead frame. The resulting cap, however, is costly and does not help with heat spreading.

For very large die sizes having many bond pads, there is no more room for additional bond pads on the die edge. For some devices, this results in bond wires forming high loops and the wire traverses of long distances over the die. The long bond wire over the die can be moved by the plastic or by other mechanical means. The wire can be forced to the edge of the die by the mechanical movement and cause a short because the die edge is bare, broken silicon left after die scribe and break.

It is the principal object of this invention to provide an improved method of plastic packaging using heat spreaders and CVD deposition of wire bonds.

SUMMARY OF THE INVENTION

In accordance with one embodiment of the invention, a die and lead frame are placed on a heat spreader. A filler material is placed between the die and the lead frame. The filler may be selected from a group of materials which includes: oxide; poly amide; a combination of layers of oxide and poly amide; or plastic or a plastic which has plastic or glass coated beads of metal. If plastic filler is selected, leads are formed from pyrolized filler and laser deposited metal. After the leads are formed, various protective materials are placed over the die to protect it from the package. A second heat spreader or other device may be placed over the protective materials if desired. Typical devices are batteries, capacitors or other die. Applicants' structure is more stable than existing structures because the active element, the die, is not in direct contact with the plastic package.

Applicants' invention reduces many of the problems discussed in the Background of the Invention. No plastic from the package is allowed to touch the die front or back. The heat spreaders trap the die between them. In this way there is no shear stress on the die. The heat spreaders also dissipate the heat from the die. Furthermore, there is no need for the heat spreader to have a fancy cap because the surface of the die is flat and there are no bond wires coming from the top of the die. The bonds can not be sheared off of the die because they are not wire loops nor are they in the plastic. Thus, the heat spreader protects the bonds and at a lower cost than the fancy cap.

The interconnects can be made anywhere on the device because there is no pressure necessary to make the bond. The interconnects can be made on a bond pad as small as the limits of the etching and deposition process will allow. The leads to the bond can cross the region between the die and the lead frame on the filler used to bridge the gap. Plastic can be used as a filler because it can be carbonized or slightly melted, to form a conductive bridge across the gap. The bridge being conductive means the lead deposition can break going across the gap and not affect the continuity of the lead because the carbonized material carries the current in the break. The unreacted filler between the carbonized regions serves as an insulator to electrically isolate one lead from another.

Since no bumps are required to build the bond, there is no limitation as to the size of the bond pad. Because of the seal on the die edge, the bond wire leads can touch the die edge where a normal bond wire can not touch the bond edge.

An added benefit can be gained by placing a glass window over the device. Laser activated make links can be programmed through the window. EPROM's can be deprogrammed through the window.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENT

Figure 1:
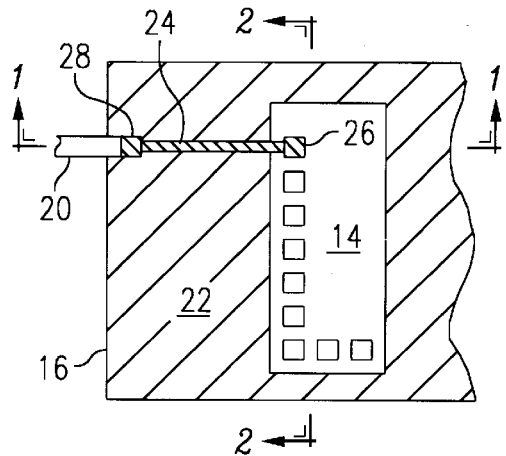
FIG. 1 is a plan view according to the invention.
Figure 2:
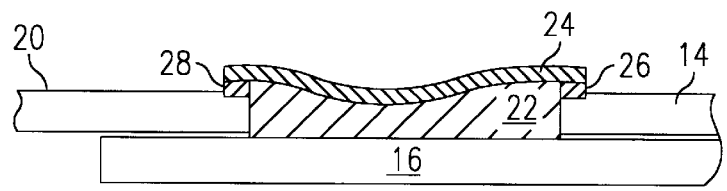
FIG. 2 is an elevational view in section of the device of FIG. 1, taken along the lines 1—1 and 2—2.
Figure 3:
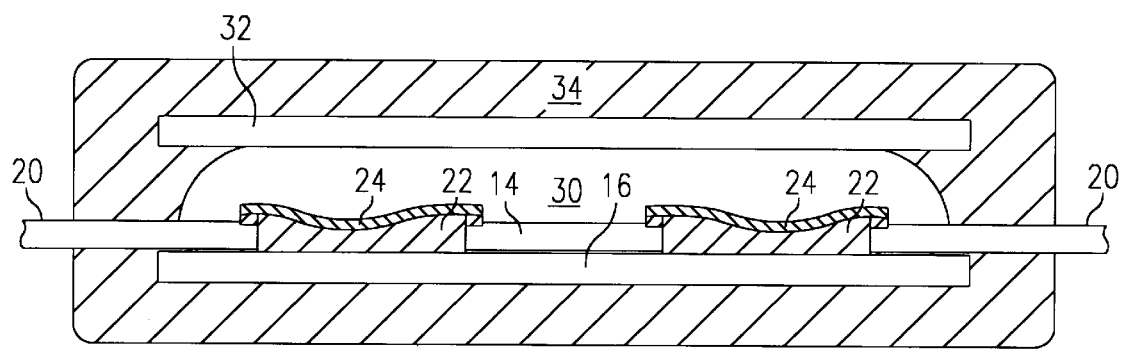
FIG. 3 is an elevational view of the device of the preferred embodiment.

In FIGS. 1 and 2, a die 14, having its edge sealed against leakage, is placed on a heat spreader 16. The sealer can be oxide, nitride or filler overlapping of the die's edge. The die 14 should be in intimate contact with heat spreader 16, as shown in FIG. 2. A lead frame 20 is positioned around die 14 on heat spreader 16. A filler material 22 is placed between die 14 and lead frame 20. Any method for dispensing filler material 22 that will accomplish the job may be used. Some of the more common methods include silk screening, CVD deposition of material, spraying or injection. The filler material is used to support deposited leads. A high intensity energy source (laser for example) is focused on the region where the deposition is to take place. A bond lead 24 of a conducting material, for example: CVD metal followed by photomask patterning; CVD metal directly deposited by laser, E-BEAM, or other high energy point source; evaporated metal that is masked for patterning by photomasking; metals deposited and then patterned by metal forming techniques, is deposited on die 14 from bond pad 26 across die 14 and filler material 22 to a bond location 28 of lead frame 20. A protective covering 30 can be deposited on die 14, as shown in FIG. 3. Examples of such protective coatings include: PIX, PIQ, silicon heat transfer grease, nitride, oxide, etc. Because the surface of die 14 is flat, relatively speaking, as compared to the wire bonding process, a heat spreader 32 can be placed on top of die 14 in a manner similar to heat spreader 16 under the die. If no heat spreader is wanted on top of die 14, the PIQ or PIX will act to prevent the plastic package from stripping the bonds. And while the invention has thus far been described as an inter-connection of a bond lead 24, a bond pad 26 and a bond location 28 of lead frame 20, it is to be under stood that there can be repetitive patterns of interconnects. A mask can be used to cause a patterned deposition such as would be done to pattern a wafer using a direct step on a wafer printer or the pattern can be drawn by the energy source. After all interconnections are completed, the device is encapsulated in a package 34. CVD deposition can be used to coat the outside of the package with a nitride coating or an oxide to prevent the package from taking in moisture.

Figure 4:
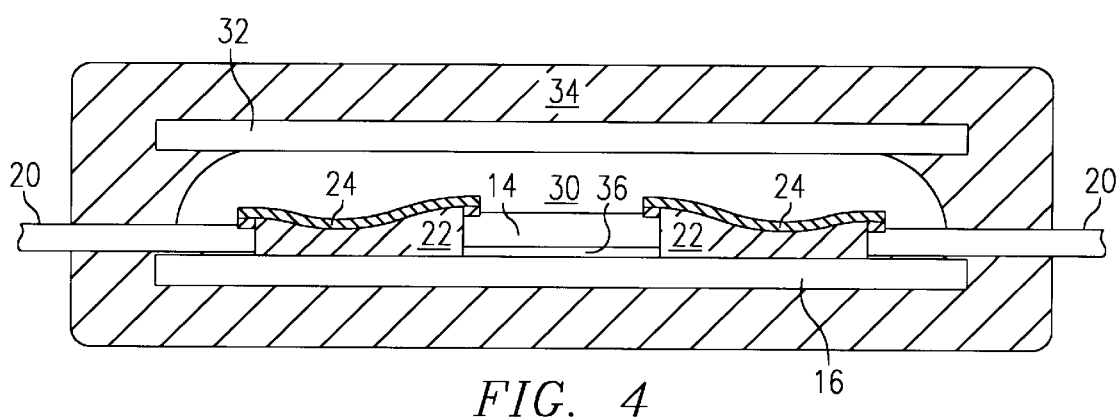
FIG. 4 is a plan view of another embodiment of the invention.

In another embodiment of the invention, as shown in FIG. 4, a lubricating material 36 is placed between die 14 and heat spreader 16. Lubricating material 36 helps prevent fractures in die 14 due to differential expansion between heat spreader 16 and the die. Silicon lubricants and heat sink compounds are ideal for this material.

Figure 5:
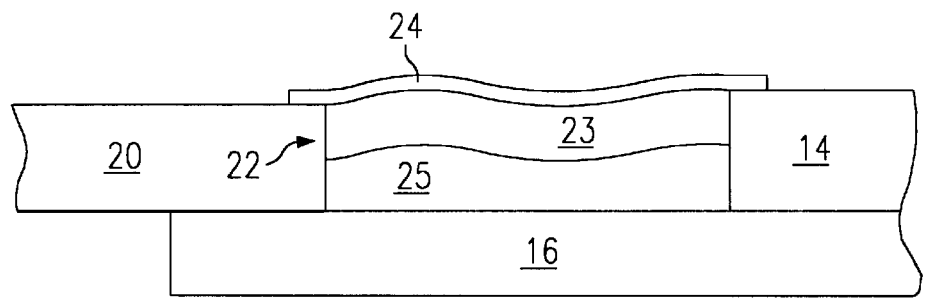
FIG. 5 is an elevational view in section, greatly enhanced, of the device of FIG. 1, taken along the lines 1—1 and 2—2, according to one embodiment of the invention.
Figure 6:
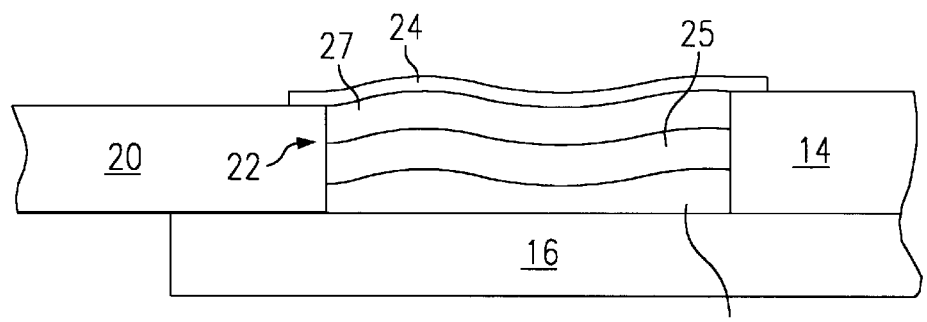
FIG. 6 is an elevational view in section, greatly enhanced, of the device of FIG. 1, taken along the lines 1—1 and 2—2, according to another embodiment of the invention.

In other embodiments of the invention, filler material 22 may composed of: plastic; oxide; poly amide; or various combinations of layers of oxide and poly amide. In FIG. 5, filler material 22, shown generally, includes a layer of oxide 23 above and adjacent a layer of poly amide 25. In FIG. 6, filler material 22, shown generally, includes a layer of oxide 27 above and adjacent a layer of poly amide 25, which itself is above and adjacent a layer of oxide 23. FIGS. 5 and 6 disclose but a few of many possible combinations of filler materials.

In yet another embodiment of the invention (not shown), the filler material 22 can have spheres of gold or other conductive materials covered with a hard electrically insulating coating. If filler 22 is to have conductive spheres, the coating on the spheres should be easily reacted with $O_2$ to create $CO_2$ which will leave a deposit of metal or must break under the affects of energy source such as a laser or electron beam.

If an embodiment is selected which uses oxide, poly amid or combination layers of the two, it is desireable to deposit a conductive strip of material along the same path that the deposit of the metal of the bond lead will traverse, thereafter deposit the strip of metal for the bond lead.

Figure 7:
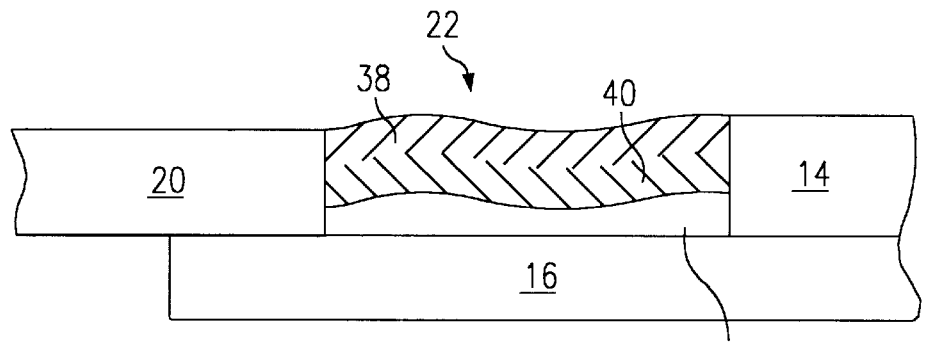
FIG. 7 is an elevational view in section, greatly enhanced, of the device of FIG. 1, taken along the lines 1—1 and 2—2, according to yet another embodiment of the invention.
Figure 8:
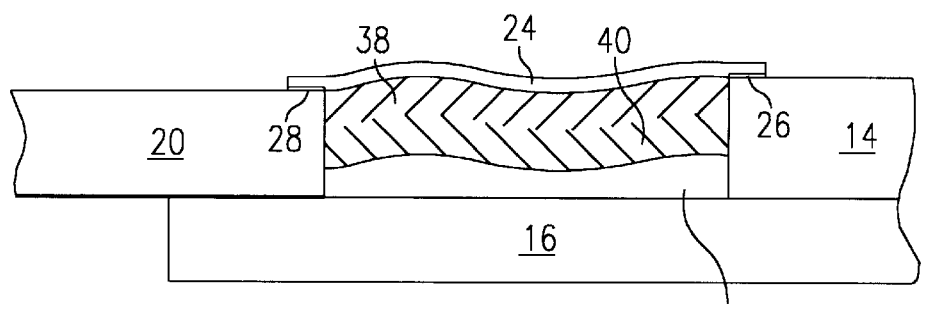
FIG. 8 is the detail view of FIG. 7 with the addition of a bond lead.

In still another embodiment of the invention wherein plastic is selected as the filler material, as shown in FIG. 7, a laser or other high intensity source of focused energy scans filler material 22 after the filler material is placed between die 14 and lead frame 16. The filler material, shown generally at 22, is pyrolized leaving a dense, fibrous, stretchy plastic/carbon conductive film 38. If gold or other metal filler is in the filler material, the metal forms a dense conductive film supported by the underlying or reacted filler material 40 and the unreacted filler material 42. A lower intensity light which continues the polymerization process can now be used to harden the remainder of the plastic that is to remain. At this point, a rinse may be used to remove the unreacted plastic if so desired. The rinse may also be done after the final deposition of the bond lead. Bond lead 24 is deposited, as shown in FIG. 8, in the manner described in the preferred embodiment.

Figure 9:
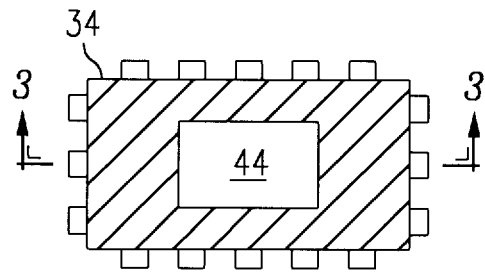
FIG. 9 is a plan view of the plastic package according to another embodiment of the invention.

In yet still another embodiment of the invention, FIG. 9 illustrates the relationship of glass window 44 to plastic package 34. Die 14 may be larger or smaller than the opening of glass window 44. Glass is used generically as some optically transmitting medium that will allow light to impinge on the device. The wave length of the light does not need to be visible. For example, a Germanium window would allow programming of make-link diode structures, with infrared radiation.

Figure 10:
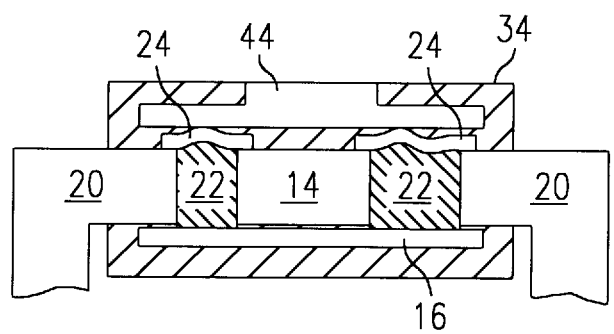
FIG. 10 is an elevational view in section of the device of FIG. 9, taken along lines 3—3.
Figure 11:
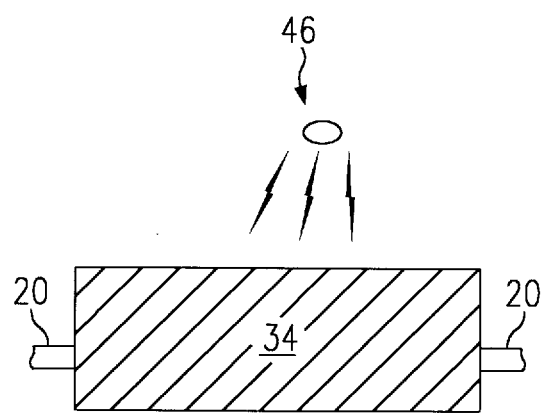
FIG. 11 is an elevational view of the device of claim 9.

FIG. 10 illustrates die 14 in plastic package 34 with a glass window 44. FIG. 11 illustrates a plastic package 34 being irradiated by a high intensity energy source 46, such as light, plasma, ion beam, or electron beam to name a few possibilities.

Figure 12:
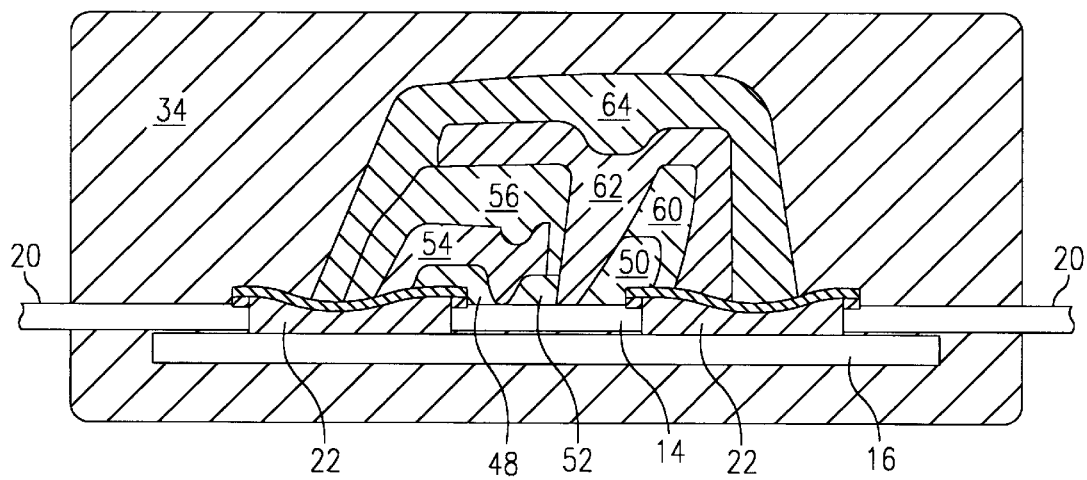
FIG. 12 is an elevational view in section of a device of yet another embodiment.

FIG. 12 illustrates still yet another embodiment of the invention wherein internal capacitors, if needed, can be directly deposited on die 14. For example, a capacitor is formed from layers 54, 56 and 62 wherein layers 54 and 62 are the plates of the capacitor and layer 56 is the separating dielectric. FIG. 11 is but one example of a structure having complex interconnects made at the die surface. As an example, PIX or oxide layers 48 and 50 are each formed partially on a bond lead 22 and on die 14. A separate PIX layer 52 is formed above and adjacent die 14 and between PIX layers 48 and 50. A metal layer 54 is formed which completely covers the exposed surface of layer 48 and also fills the exposed surface between layers 48 and 52. A metal layer 56 is formed which completely covers the exposed surface of layer 54 and any remaining exposed top surface of layer 52. A PIX layer 60 is formed which encompasses part of the exposed surface of layer 50. A metal layer 62 is formed which encompasses the exposed surfaces of layers 56 and 62. The entire structure is then sealed in package 34.

Figure 13:
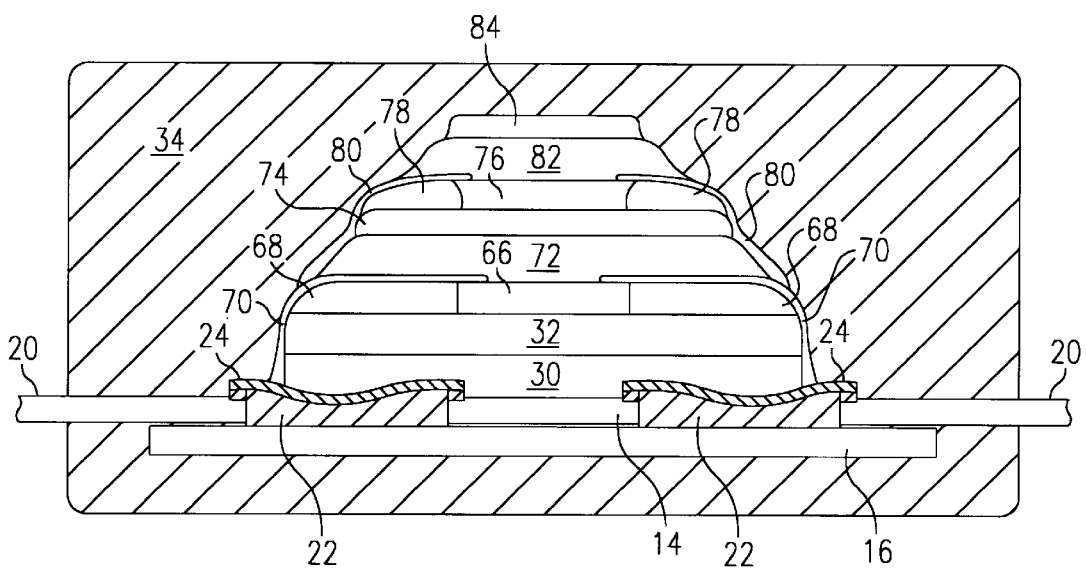
FIG. 13 is an elevational view in section of a device of still yet another invention.

FIG. 13 illustrates but one of many possible combinations which stack many devices and active/passive components together with appropriate heat spreaders to form a complete computer system in a stack. In FIG. 13, a die 66 is positioned above and adjacent heat spreader 32 (of the invention of FIG. 3). Filler material 68 is positioned to surround die 66. Bond leads 70 are formed from bond leads 24 to bond pads on die 66. A PIQ layer 72 is placed above filler 68, bond leads 70 and die 66. A heat spreader 74 is placed above PIQ layer 72. A die 76 is placed above heat spreader 74. Filler material 78 is positioned to surround die 76. Bond leads 80 are formed from bond leads 70 to bond pads on die 76. A PIQ layer 82 is placed above die 76, filler material 78 and bond leads 80. A heat spreader 84 is placed above PIQ layer 82. The entire structure is then sealed in package 34.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A packaged device, comprising:

a semiconductor die;

a lead frame positioned around said die;

a plastic filler material, including gold or other conductive materials, between said die and said lead frame; and at least one conductive bond lead from a bond pad on said die, across the die and said filler material to said lead frame, said filler material supporting said conductive bond lead.

2. A packaged device, comprising:

a semiconductor die;

a lead frame positioned around said die;

a plastic filler material continuous from said die to said lead frame; and at least conductive bond lead formed from pyrolized filler and laser deposited metal on said filler material from a bond pad on said die to said lead frame.

3. A packaged device, comprising:

a semiconductor die;

a lead frame positioned around said die;

a plastic filler material continuous from said die to said lead frame; and at least one conductive bond lead formed on said filler material from a bond pad on said die to said lead frame, said filler material being carbonized directly beneath said at least one conductive bond pad.

4. A packaged device, comprising:

a first heat spreader;

a semiconductor die positioned on said heat spreader;

a lead frame positioned on said heat spreader and around said die;

a plastic filler material continuous from said die to said lead frame; and at least one conductive bond lead formed from pyrolized filler and laser deposited metal on said filler material from a bond pad on said die to said lead frame.

5. A packaged device, comprising:

a first heat spreader;

a semiconductor die positioned on said heat spreader;

a lead frame positioned on said heat spreader and around said die;

a plastic filler material continuous from said die to said lead frame; and at least one conductive bond lead formed on said filler material from a bond pad on said die to said lead frame, said filler material being carbonized directly beneath said at least one conductive bond lead.

6. A packaged device, comprising:

a semiconductor die;

a lead frame positioned around said die;

a filler material continuous from said die to said lead frame;

at least one conductive bond lead formed on said filler material from a bond pad on said die to said lead frame;

a protective covering above and adjacent said die;

a heat spreader above and adjacent said protective covering;

a second semiconductor die above and adjacent said heat spreader above and adjacent said protective covering;

a second filler material on said heat spreader above and adjacent said protective covering, said second filler material surrounding said second semiconductor die; and a second at least one conductive bond lead formed on said second filler material from a bond pad on said second semiconductor die to said at least one conductive bond lead.

* * * * *